US012336088B2

(12) United States Patent
Balakrishnan et al.

(10) Patent No.: US 12,336,088 B2
(45) Date of Patent: Jun. 17, 2025

(54) INDUCTIVE COUPLING STRUCTURES FOR REDUCING CROSS TALK EFFECTS IN PARALLEL BUS TECHNOLOGIES

(71) Applicant: Intel Corporation, Santa Clara, CA (US)

(72) Inventors: Ranjul Balakrishnan, Bangalore (IN); Roman Meltser, Atlit (IL); Prabhat Ranjan, Bangalore (IN); Shivani R. Jain, Ahmedabad (IN)

(73) Assignee: Intel Corporation, Santa Clara, CA (US)

( * ) Notice: Subject to any disclaimer, the term of this patent is extended or adjusted under 35 U.S.C. 154(b) by 849 days.

(21) Appl. No.: 17/353,163

(22) Filed: Jun. 21, 2021

(65) Prior Publication Data

US 2021/0315097 A1 Oct. 7, 2021

(51) Int. Cl.
*H05K 1/02* (2006.01)
*H01F 17/00* (2006.01)

(52) U.S. Cl.
CPC ....... *H05K 1/0233* (2013.01); *H01F 17/0006* (2013.01); *H05K 1/0216* (2013.01); *H01F 2017/0073* (2013.01); *H05K 2201/1003* (2013.01)

(58) Field of Classification Search
CPC .............. H05K 1/0233; H05K 1/0216; H05K 2201/1003; H01F 17/0006; H01F 17/0073
See application file for complete search history.

(56) References Cited

U.S. PATENT DOCUMENTS

| | | | |
|---|---|---|---|
| 2009/0244866 A1* | 10/2009 | Kawano | H01F 27/40 336/200 |
| 2018/0069396 A1* | 3/2018 | Schuett | H02H 9/046 |
| 2019/0014665 A1* | 1/2019 | Yazaki | H05K 1/181 |
| 2021/0274647 A1* | 9/2021 | Tenno | H05K 1/0237 |
| 2021/0279935 A1* | 9/2021 | Murdock | G06T 13/40 |

* cited by examiner

Primary Examiner — Timothy J Thompson
(74) Attorney, Agent, or Firm — Alliance IP, LLC

(57) ABSTRACT

In one embodiment, an apparatus includes a circuit board having a parallel bus with a first trace and a second trace, a first inductive coil coupled to the first trace, and a second inductive coil coupled to the second trace. The first and second inductive coils are arranged to inductively couple with one another to reduce cross talk effects in the parallel bus.

24 Claims, 14 Drawing Sheets

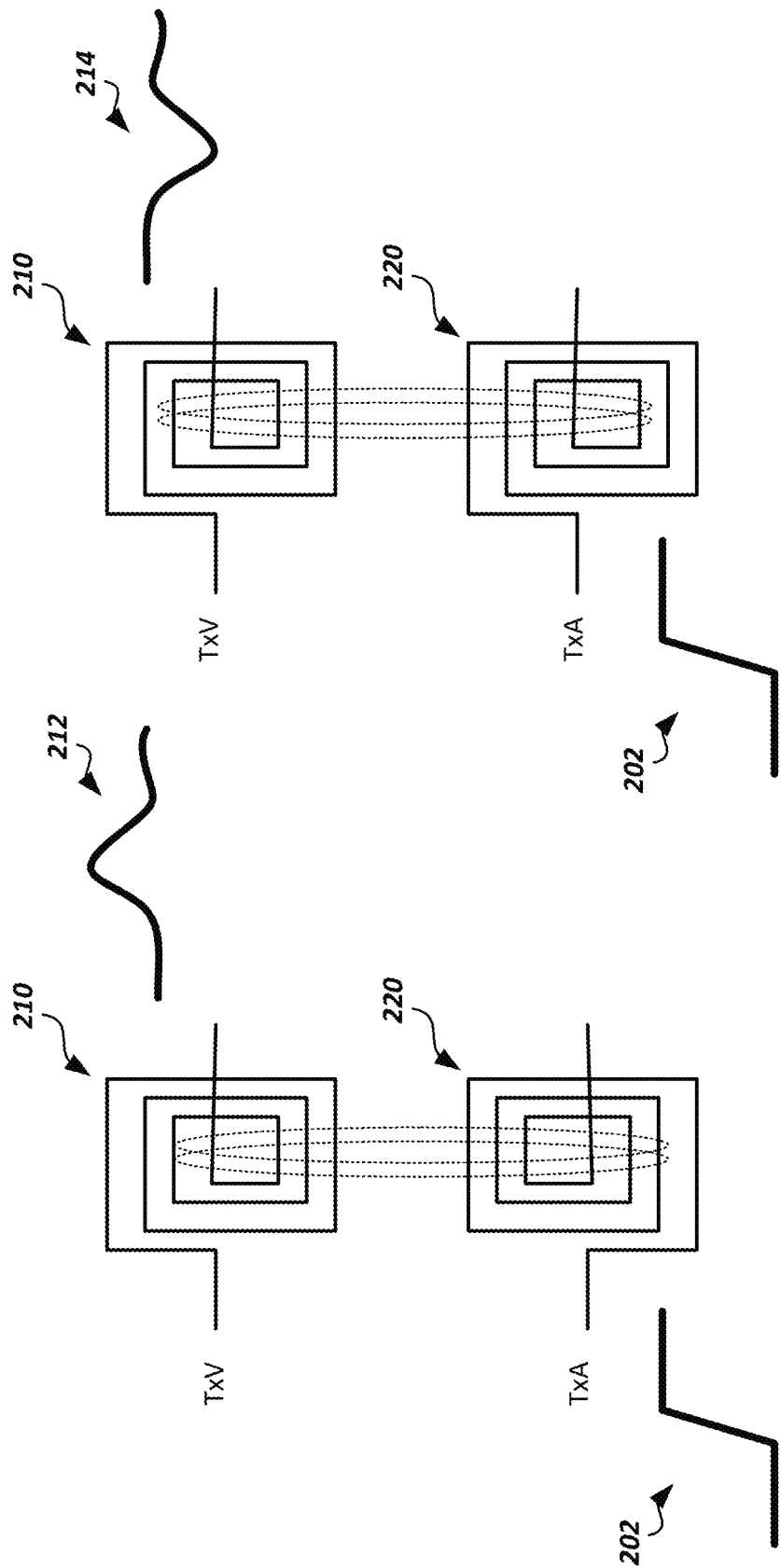

INDUCTIVE COUPLING STRUCTURES FOR REDUCING CROSS TALK EFFECTS IN PARALLEL BUS TECHNOLOGIES

TECHNICAL FIELD

This disclosure relates in general to the field of computer systems and, more particularly, to inductive coupling structures for parallel bus technologies.

BACKGROUND

One challenge in high-speed parallel bus design is mitigating cross talk resulting from the dense routings and vertical transitions on circuit boards, e.g., in a System-on-Chip (SoC) die, package, and/or motherboard. Channel loss and impedance discontinuity can both contribute to inter-symbol interference (ISI) and are additional issues caused by cross talk.

BRIEF DESCRIPTION OF THE DRAWINGS

FIGS. 2A-2B illustrate example inductive coupling structures of opposite polarity.

Like reference numbers and designations in the various drawings indicate like elements.

DETAILED DESCRIPTION OF EXAMPLE EMBODIMENTS

Figure 1A:
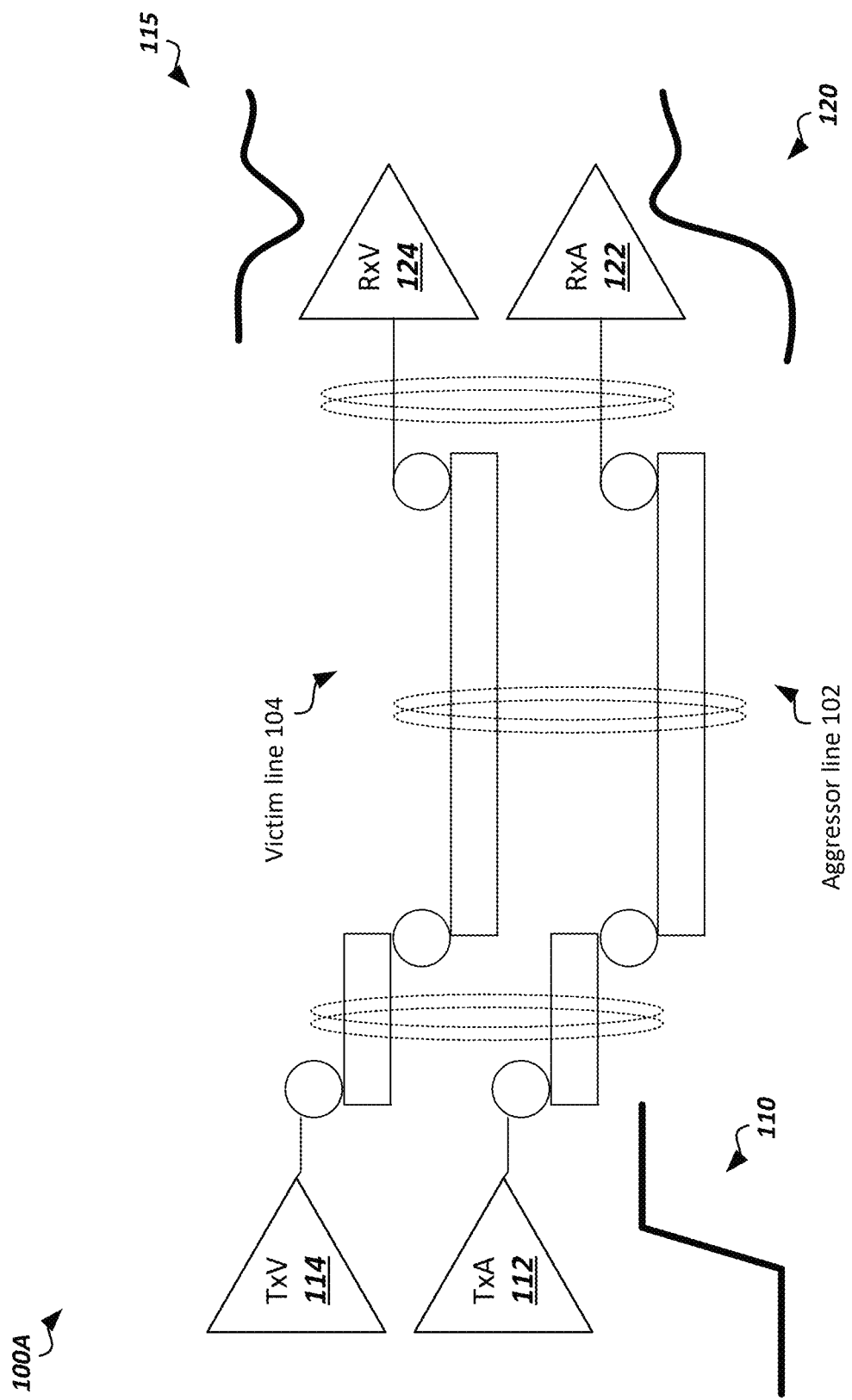
FIGS. 1A-1D illustrate example parallel bus systems without and with inductive coupling structures in accordance with the present disclosure, respectively.

In the following description, numerous specific details are set forth, such as examples of specific configurations, structures, architectural details, etc. in order to provide a thorough understanding of the present disclosure. It will be apparent, however, to one skilled in the art that these specific details need not be employed to practice embodiments of the present disclosure. In some instances, well known components or methods may be utilized, and such details haven't been described in detail in order to avoid unnecessarily obscuring embodiments of the present disclosure.

In a parallel bus channels (e.g., memory bus channels), far end cross talk (FEXT) may be dominated by inductive cross talk. This can be due to the cross talk from vias and connectors, microstrip segments, or from the vertical transitions that may be inductive in nature (due to longer return loops). Also, in many memory circuit board packets (e.g., dynamic random-access memory (DRAM) packages), it has been observed that mutual inductance effects dominate over the mutual capacitance effects, and altogether, the channel tends to be ruled by inductive FEXT.

Current design practices may include strip line routing on the motherboard to minimize cross talk, as the symmetrical strip line structure with homogeneous medium results in approximately zero FEXT. However, at the same time, the homogeneous symmetrical strip lines are not contributing anything to nullify the existing channel cross talk from remaining segments of the channel. This demands expensive platform solutions to enable dense parallel bus routing during system miniaturization with platform real estate reduction and motherboard layer reductions (which may have bill of material (BOM) implications).

Other proposed solutions to the cross talk issue have included: SoC receiver (Rx) side cross talk cancellation circuit: HPF+ Summer at Pre-amplifier or Sampler, SoC transmitter (Tx) side phase based cross talk cancellation circuit-to nullify timing shift resulted from cross talk, SoC Tx side derivative cross talk cancellation circuit—with capacitive coupling, SoC Tx side voltage mode cancellation by signed swing modulation, and Stubby lines on the motherboard/PCB to increase the capacitive coupling to reduce the overall FEXT. However, the above circuit designs cannot equalize the channel response (whereas embodiments herein can be utilized to equalize the channel loss/distortion with tuned value of series inductance in addition to the crosstalk cancellation capability by tuning the mutual inductance). Further, Stubby lines require very complex routing guidelines on-platform and are accordingly difficult to implement.

Embodiments described herein incorporate a passive, coupled inductive coil structure (e.g., similar to a transformer) on the die that may mitigate significant amounts of inductive cross talk sourced, e.g., at a SoC package or motherboard, resulting in significant FEXT reduction in the overall channel. In particular embodiments, for instance, a coupled inductive coil structure may be incorporated in the active silicon or passive interposer (designed at the output of buffer), which can create a neutralizing coupled signal on the victim trace by optimizing the coil winding direction which will tend to cancel the coupling noise generated from the channel (e.g., SoC Package, motherboard, memory device (e.g., a DRAM package)) to create significant reduction of overall FEXT in the channel. In some cases, certain embodiments may allow for equalization at the transmit (Tx) and/or receive (Rx) side of a bus to flatten the overall channel response and minimize incident wave distortion that may occur from cross talk effects.

This can enable cost effective platform solutions, reducing the motherboard size and enabling high performance, small form factor systems. Moreover, the inductive characteristics of the coupled inductive coil structures described herein can help to compensate or equalize the inherent low pass filter (LPF) trends of the channel to improve the overall ISI behavior. Certain embodiments may also compensate for excessive inductive cross talk in the end-to-end channel, allow denser routing, e.g., to push for higher data rates, enable a smaller motherboard, with a lower layer count that is not possible with current design practices, allow for smaller form factors, and/or reduce the risk of higher cross talks in Type-3 platforms.

FIGS. 1A-1D illustrate example parallel bus systems without and with inductive coupling structures in accordance with the present disclosure, respectively. The scenarios shown may represent, for example, a processor or system-on-chip (SoC) (as the transmitter) writing to memory (as the receiver) in FIGS. 1A, 1B, 1D or the processor/SoC reading from memory in FIG. 1C.

FIG. 1A illustrates an example parallel bus system 100A in which cross talk effects can be seen in the channel. The example system 100A includes two lines 102, 104, and in the example shown, the line 102 is an "aggressor" line, which may refer to a line that causes cross talk effects in other lines of the parallel bus, and the line 104 is a "victim" line, which may refer to a line upon which cross talk effects can be seen (from an aggressor line, e.g., 102) in the parallel bus. The lines 102, 104 may be any suitable electrical path for carrying signals of a parallel bus. For example, the lines 102, 104 may include traces on a circuit board (e.g., a printed circuit board (PCB), in certain instances. Each line includes transmitter circuitry (e.g., 112 for line 102, 114 for line 104) and receiver circuitry (e.g., 122 for line 102, 124 for line 104).

In the example shown, when a signal (e.g., step signal 110) is introduced on the aggressor line 102 by transmitter circuitry 112, a signal is generated in the victim line 104 due to electromagnetic coupling between the lines 102, 104. As a result, the receiver circuitry 124 sees a signal (e.g., signal 115) even though no signal was introduced (i.e., a digital "0" signal) on the line 104 by the transmitter circuitry 114. In instances where a signal is introduced on the line 104 (i.e., a digital "1" signal), the noise may also be present. These effects may be referred to as cross talk effects. In addition, the signal received at the receiver circuitry 122 (e.g., signal 120) is distorted from the original signal (e.g., 110) due to channel loss and inter symbol interference (ISI).

Figure 1B:
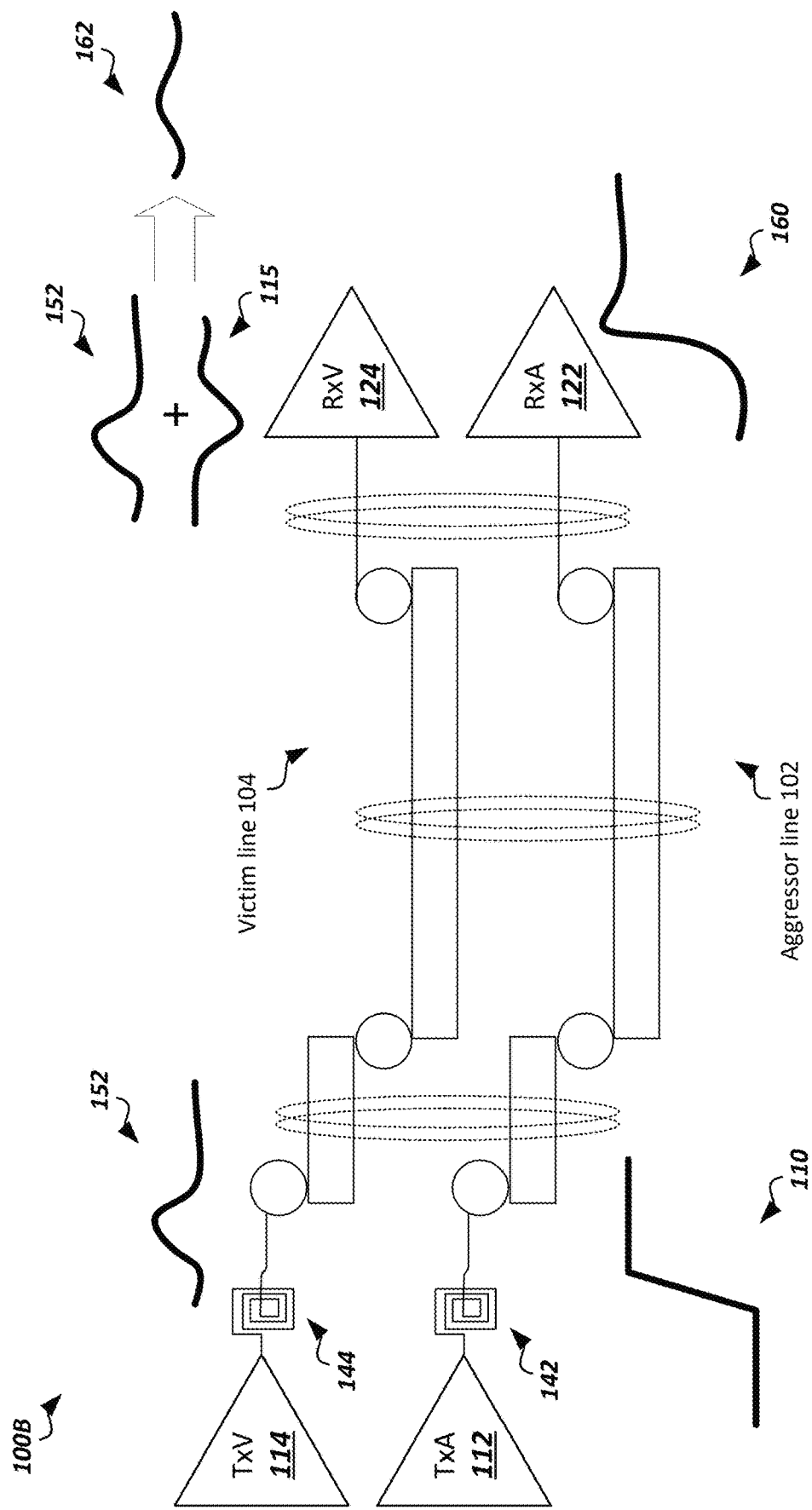

To nullify the inductive cross talk (e.g., negative peak noise from a positive rising aggressor) generated in the parallel bus, transmitter-side inductive coupling structures may be introduced in certain embodiments, e.g., as shown in FIG. 1B and described below. In other embodiments, the inductive coupling structures may be included on the receiver-side in addition to, or in lieu of the transmitter-side coupling structures. By correctly choosing the transformer loop direction, the coupled signal polarity can be controlled (either in positive magnitude or negative magnitude) to neutralize the inherent cross talk in the channel as described further below with respect to FIG. 2.

FIG. 1B illustrates an example parallel bus system 100B that includes an inductive coupling structure. In particular, the example system 100B includes the same lines 102, 104, transmitter circuitry 112, 114, and receiver circuitry 122, 124 as the system 100A, but also includes the inductive coils 142, 144 between the transmitter circuitries and the lines. As shown, the introduction of the transmitter-side coupling coils 142, 144 results in a more equalized receiver side waveform and cross talk cancellation. In particular, when a signal (e.g., step signal 110) is introduced on the line 102 by the transmitter circuitry 112, the inductive coils 142, 144 cause a signal (e.g., signal 152) to also be introduced on the line 104 through the inductive coupling of the coils 142, 144. The same cross talk effects as in FIG. 1A will produce a signal (e.g., 115) as before; however, the signal introduced by the inductive coupling combines with this cross talk-introduced signal to neutralize the cross talk effect in the channel (e.g., as shown in resulting signal 162 from the combination of 115 and 152). In addition to this, the signal received at the receiver circuitry 122 (e.g., 160) of the line 102 is less distorted as well, and more closely resembles the input signal (e.g., 110).

Figure 1C:
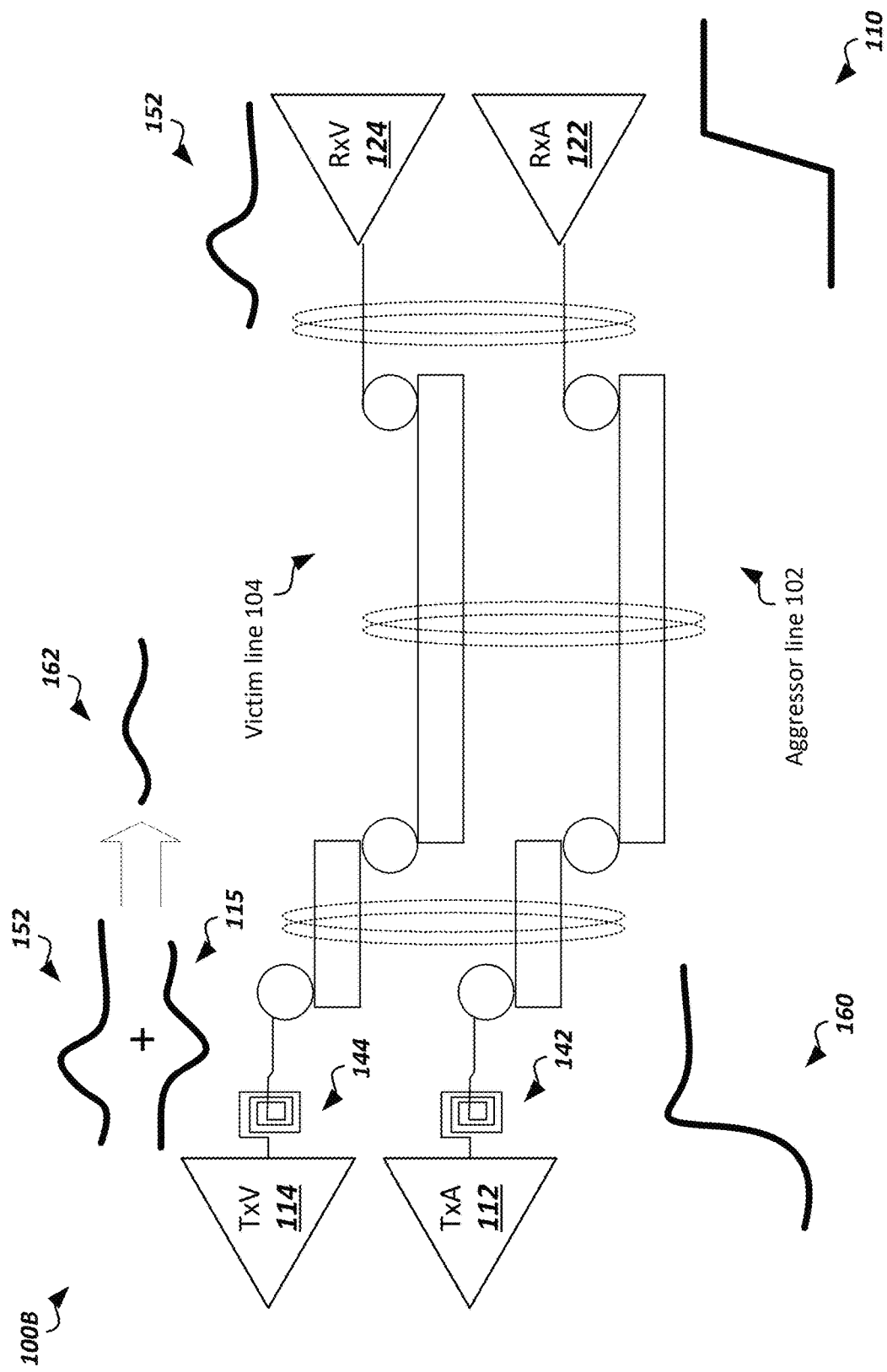

FIG. 1C illustrates the example parallel bus system 100B, but with the step signal 110 being introduced at 122 instead of 112 as in FIG. 1B. As shown, the cross talk effects can be reduced or neutralized in the same manner, whether the inductive coupling structure is located on the transmitter side (as in FIG. 1B) or the receiver side (as in FIG. 1C), illustrating that the inductive coupling structure need only be included in one side to reduce cross talk effects. This can allow for backward compatibility in certain scenarios, e.g., with a SoC having the inductive coupling structure of the present disclosure interfacing with legacy memory that do not include an inductive coupling structure. In some instances, though, the inductive coupling structure may be included on both sides of the bus as in FIG. 1D.

Figure 1D:
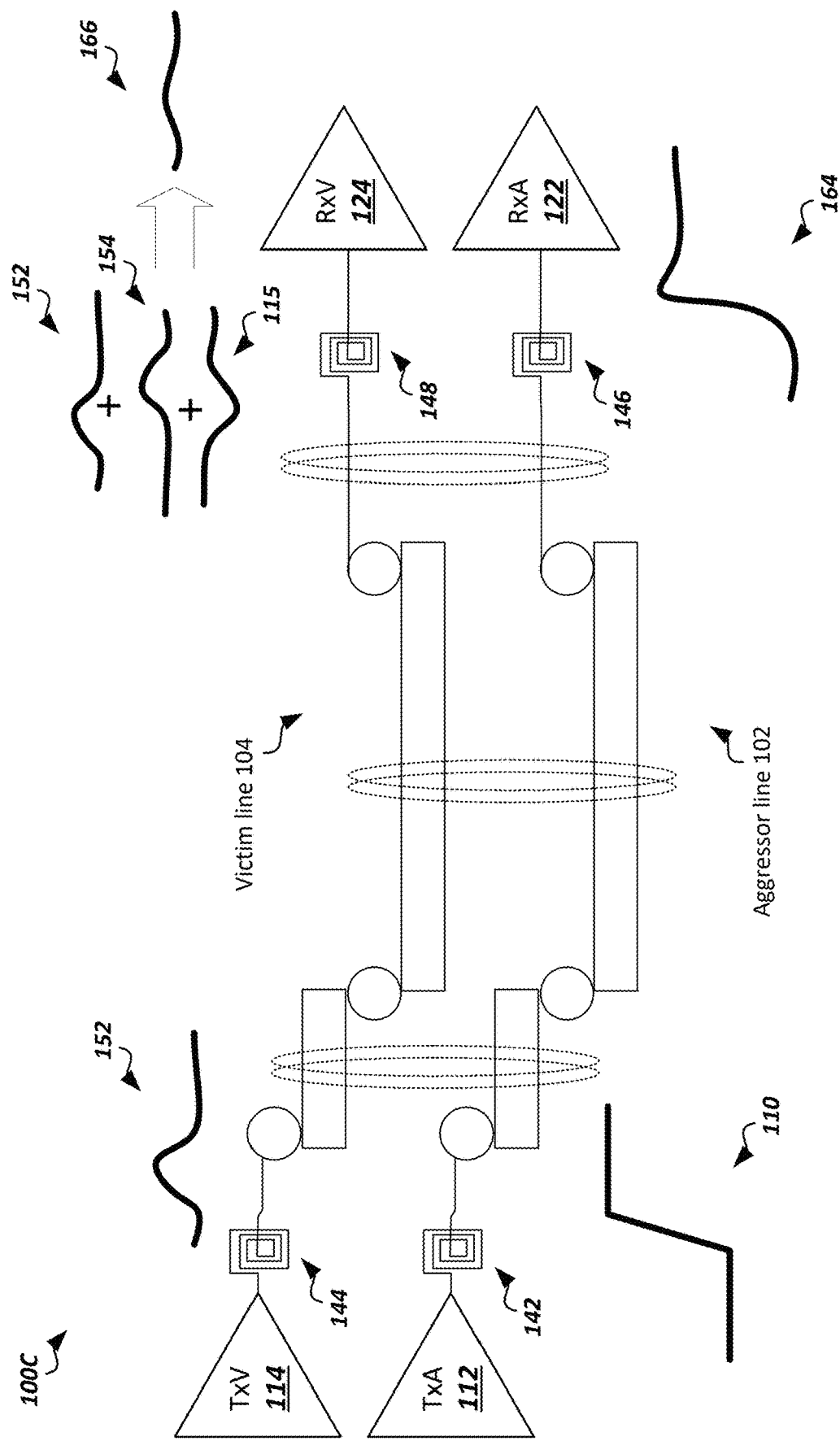

FIG. 1D illustrates an example parallel bus system 100C that includes inductive coupling structures on the transmit and receive sides. It will be understood that certain embodiments may include one or both of the receiver and/or transmitter side inductive coupling structures shown in FIG. 1D.

The example system 100C includes the same lines 102, 104, transmitter circuitry 112, 114, receiver circuitry 122, 124, and coils 142, 144 as the system 100B, but also includes additional inductive coils 146, 148 before the receiver circuitries. As shown, the introduction of the transmitter-side coupling coils 146, 148 results in a more equalized receiver side waveform and cross talk cancellation. In particular, when a signal (e.g., step signal 110) is introduced on the line 102 by the transmitter circuitry 112, the inductive coils 142, 144 cause a signal (e.g., signal 152) to also be introduced on the line 104 through their inductive coupling, and the inductive coils 146, 148 cause an additional signal (e.g., signal 154) to be introduced on the line 104 through their inducive coupling. The same cross talk effects as in FIG. 1A will produce a signal (e.g., 115) as before; however, the signals introduced by the inductive coupling structures combine with this cross talk-introduced signal to neutralize the cross talk effect in the channel (e.g., as shown in resulting signal 166 from the combination of 115, 152, and 154). In addition to this, the signal (e.g., 164) received at the receiver circuitry 122 of the line 102 is less distorted as well, and more closely resembles the input signal (e.g., 110).

FIGS. 2A-2B illustrate example inductive coupling structures of opposite polarity. In particular, FIG. 2A shows an inductive coupling structure with coils 210, 220 in a "differential" winding configuration, i.e., where the inductive coils 210, 220 have opposite winding directions. As shown, this differential winding configuration of the inductive coupling structure causes a resulting waveform (e.g., 212) in the victim line that is positive in magnitude based on a positive step input waveform (e.g., 202). FIG. 2B shows the same inductive coupling structure with coils 210, 220 in a "derivative" winding configuration, i.e., where the coils have the same winding direction. As shown, this derivative winding configuration of the inductive coupling structures causes a resulting waveform (e.g., 214) in the victim line that is negative in magnitude based on the same positive step input waveform (e.g., 202).

In certain instances, an inductive coupling structure can be developed on an active die or silicon interposer. The self-inductance can be optimized to extend, e.g., 3 dB bandwidth of transmission and can equalize the Cdie (die capacitance) LPF (low pass filter) impact. In addition, the mutual inductance between the coils of the structure can be tuned to optimize the neutralizing pulse magnitude to cancel the full channel cross talk. Consequently, better ISI response and improved cross talk cancellation can be obtained, increasing the signal to noise ratio (SNR) of the parallel bus.

Figure 3A:
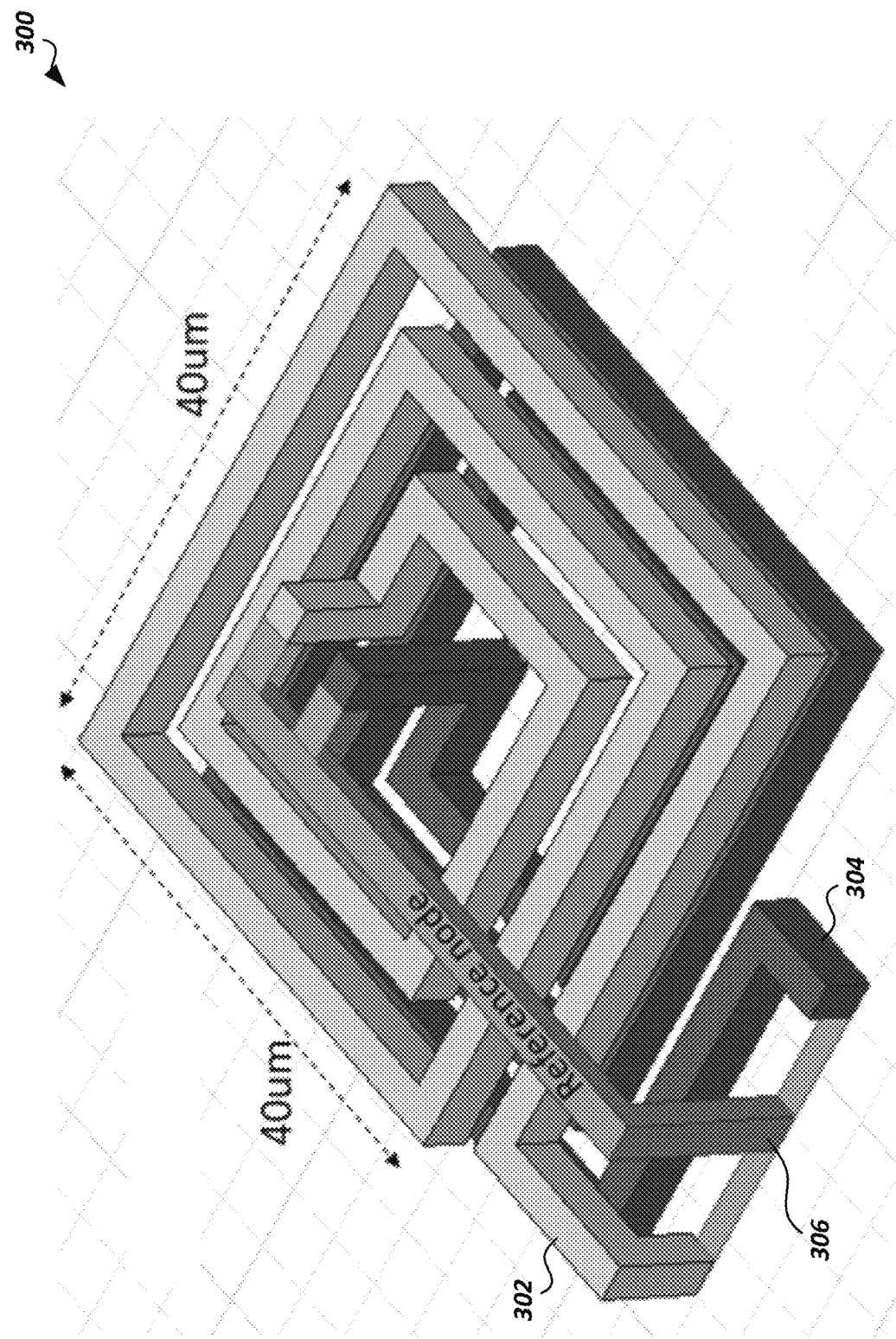
FIG. 3A illustrates an example inductive coupling structure in accordance with the present disclosure.

FIG. 3 illustrates an example inductive coupling structure 300 in accordance with the present disclosure. The example inductive coupling structure includes rectangular shaped coil traces 302, 304, which are each connected to a reference node trace 306 (which may be connected to ground in certain instances). In particular, the example inductive coupling structure 300 includes parallel coupling of the coil traces 302, 304, and is realized on bottom-most backside metal (BM) layers a circuit board or die. The coil traces 302, 304 may be chosen to be oriented in opposite directions as shown so that the far end coupling/cross talk signature is positive in nature.

Figure 3B:
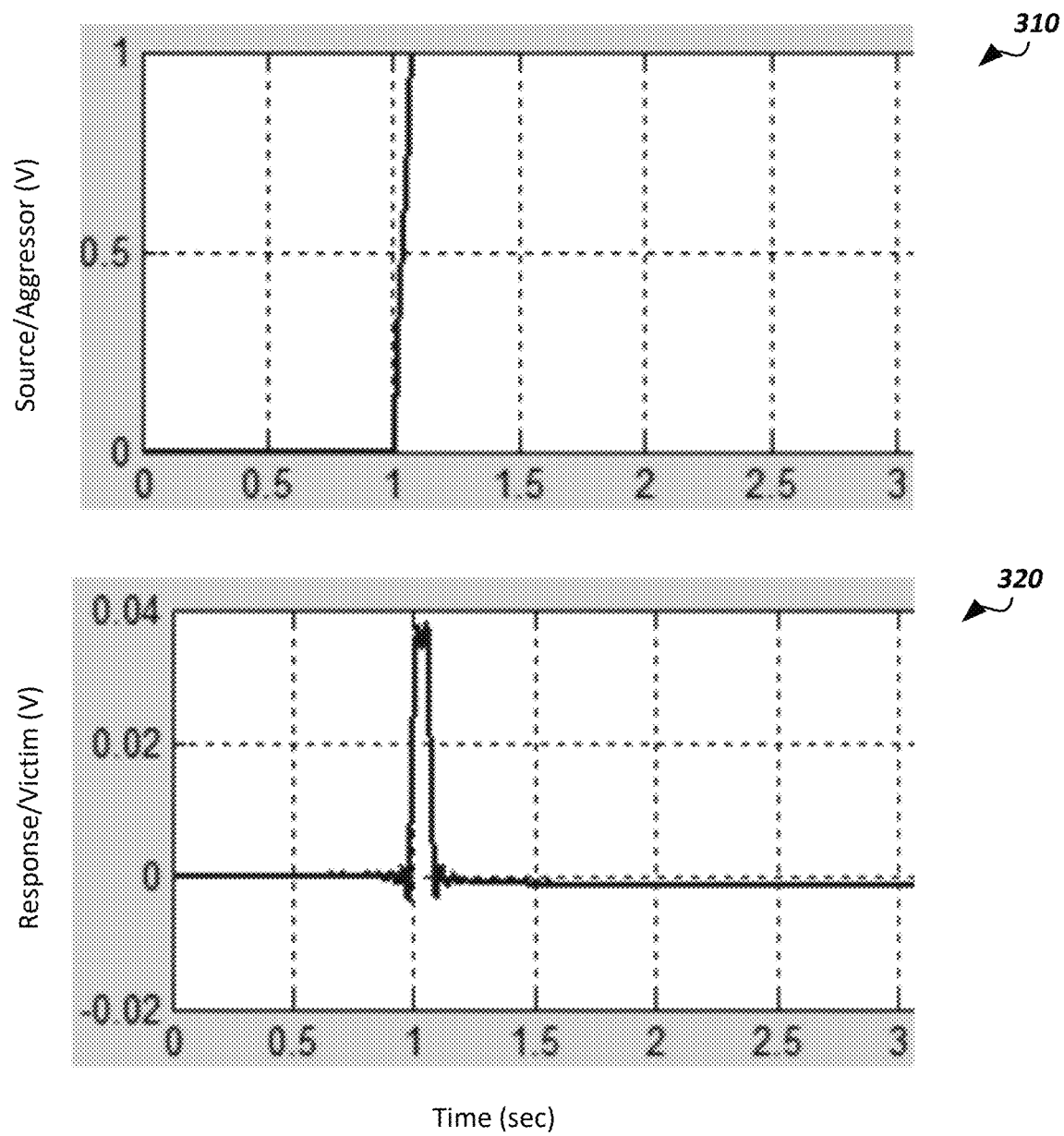
FIG. 3B illustrates example aggressor and victim waveforms on the example inductive coupling structure of FIG. 3A.

A simulation of the example structure 300 shown in FIG. 3 was performed. In the simulation, the inductive coupling structure 300 implements an inductance value of the coils 302, 304 that is approximately 0.3 nH with the dimensions shown in FIG. 3 (i.e., 40 um×40 um). The simulation results are shown in FIG. 3B, with the top waveform 310 representing an aggressor step pulse of 1V magnitude and the bottom waveform 320 representing a resulting pulse on the victim line that has relatively low magnitude (approximately 0.04 V at its peak).

Figure 4:
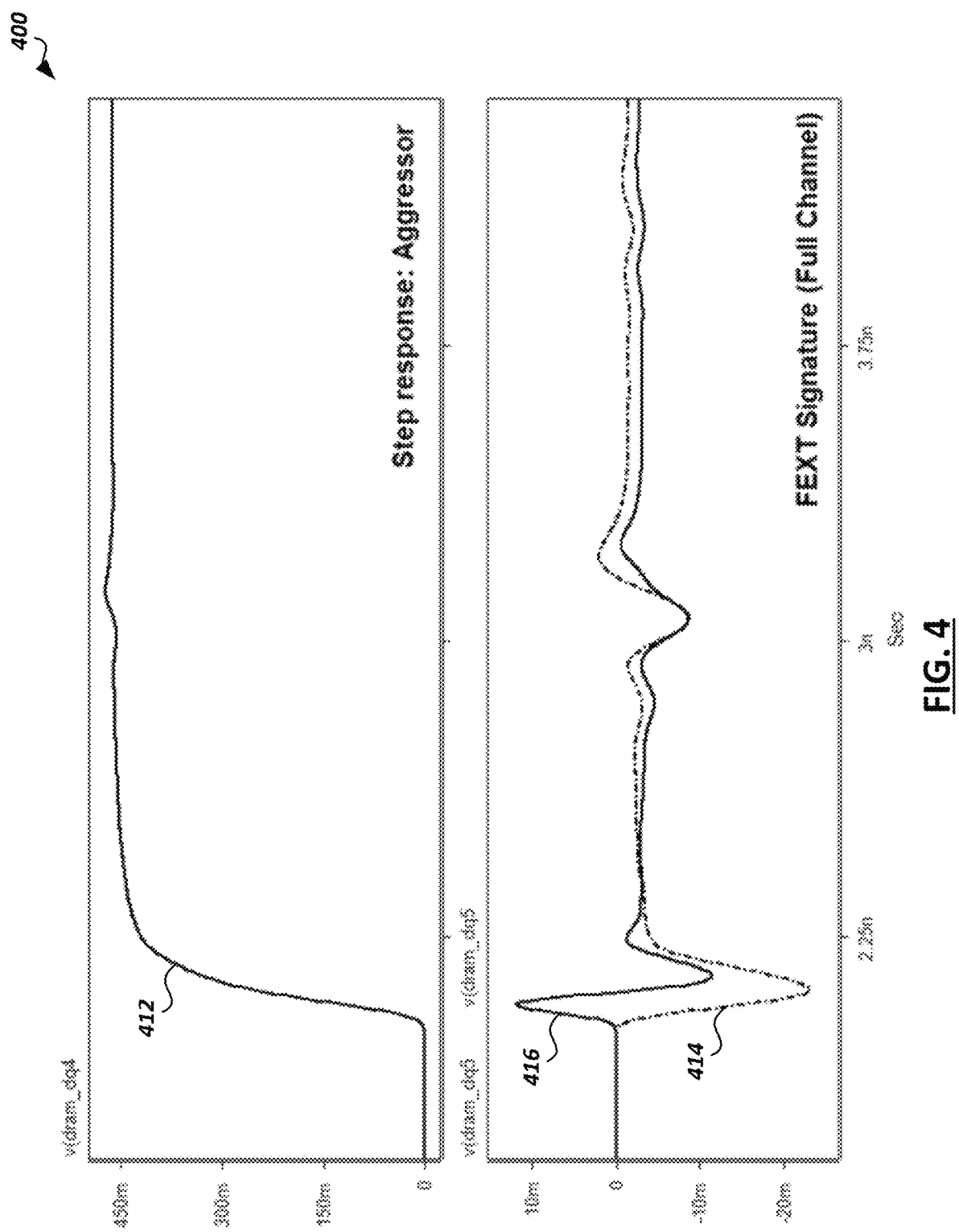
FIG. 4 illustrates example channel response waveforms with and without an inductive coupling structure in accordance with embodiments of the present disclosure.

In additional simulations, the addition of an inductive coupling structure was studied on an LP5 platform, which runs at 8533 MTs speed. An example step response is shown in the waveform 412 of FIG. 4, which is simulated to be input on an aggressor line (e.g., 102 of FIG. 1B). The resulting victim waveforms are shown in the bottom chart of FIG. 4. In particular, the waveform 414 shows the full channel response of a victim line without the inductive coupling structure in place (e.g., the scenario shown in FIG. 1A). As shown, the full channel response indicated by waveform 416 includes a large negative peak due to the inherent accumulated inductive coupling, which is dominating. In contrast, the waveform 416 shows the full channel response of a victim line with an inductive coupling structure in place (e.g., the scenario shown in FIG. 1B), in particular, a derivative configuration as described above. As shown by waveform 416, the addition of the inductive coupling structure in the transmitter circuitry helps to improve the overall channel response.

Figure 5:
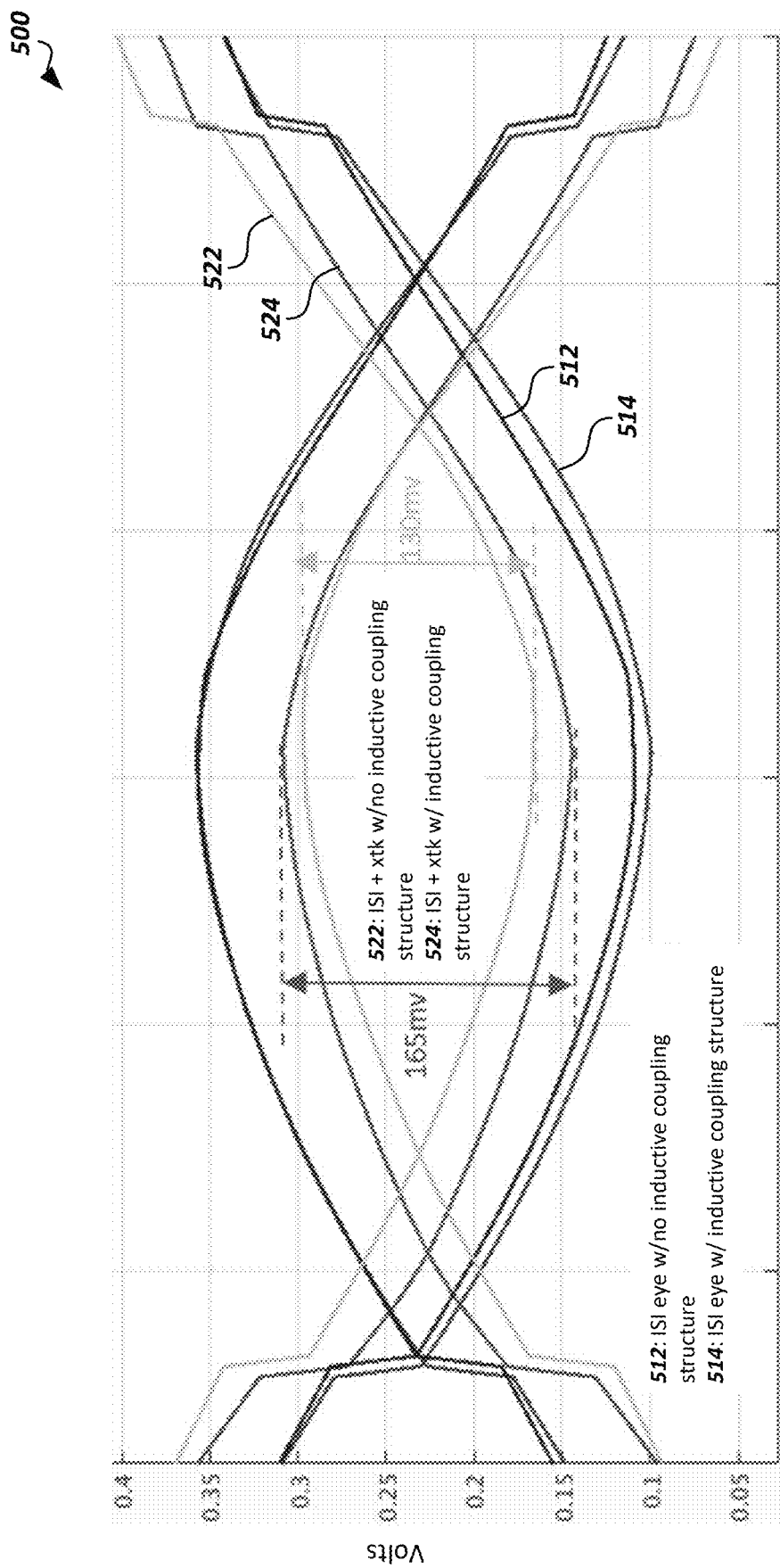
FIG. 5 illustrates an example ISI eye diagram showing simulation results for systems with and without an inductive coupling structure in accordance with embodiments of the present disclosure.

Further, high volume manufacturing (HVM) bit error rate (BER) 16 analysis of the channel was performed with and without the inductive coupling structure. The resultant eye height/eye width trend is shown in FIG. 5, and the numerical results corresponding to FIG. 5 are shown in Table 1 below.

TABLE 1

| | Equalization impact | | | Cross talk cancellation impacts | | |
|---|---|---|---|---|---|---|
| | ISI eye height (EH) | ISI eye width (EW) | ISI EH center | EH w/cross talk (XT) | EW w/XT | EHC w/XT |
| No inductive coupling structure | 93.26 mV | 32.77 ps | 80.83 mV | 13.28 mV | 6.17 ps | 9.71 mV |
| With inductive coupling structure | 104.05 mV | 36.06 ps | 96.27 mV | 43.22 mV | 18.14 ps | 37.20 mV |
| Difference | 10.79 mV | 3.29 ps | 15.44 mV | 29.94 mV | 11.97 ps | 27.49 mV |

In Table 1 above, the ISI eye height (EH), eye height center (EHC), and eye width (EW) values on the left side of the table represent the eye height, eye height at center, and eye width measured without any cross talk (e.g., at the transmitter side). These parameters indicate the opportunity to fine tune the equalization with optimum value of inductance of the coils of the inductive coupling structure. The EH, EHC, and EW values on the right side of the table represent the eye parameters convolved with a cross talk signature to comprehend the crosstalk cancellation opportunity with cross talk transformer by fine tuning the mutual coupling of the coils of the inductive coupling structure. The results show a gain of ~30 mv/12 ps with the addition of the inductive coupling structure at 8533 MTs speed on a LP5 topology.

In certain instances, the coils of the inductive coupling structure may be implemented with multiple taps/escape points from the coil, which may implement intermediate coil taps that can be used to selectively tune the inductance of the coils. Intermediate coil taps may enable control and fine tuning of the coupling inductance between the coils, without substantially penalizing equivalent Driver Ron, e.g., due to back side metal layers used by coils being low resistance metals. These intermediate taps can be routed through a multiplexer that allows for selection of a particular tap of many taps, providing control over the final coil inductance.

Figure 6:
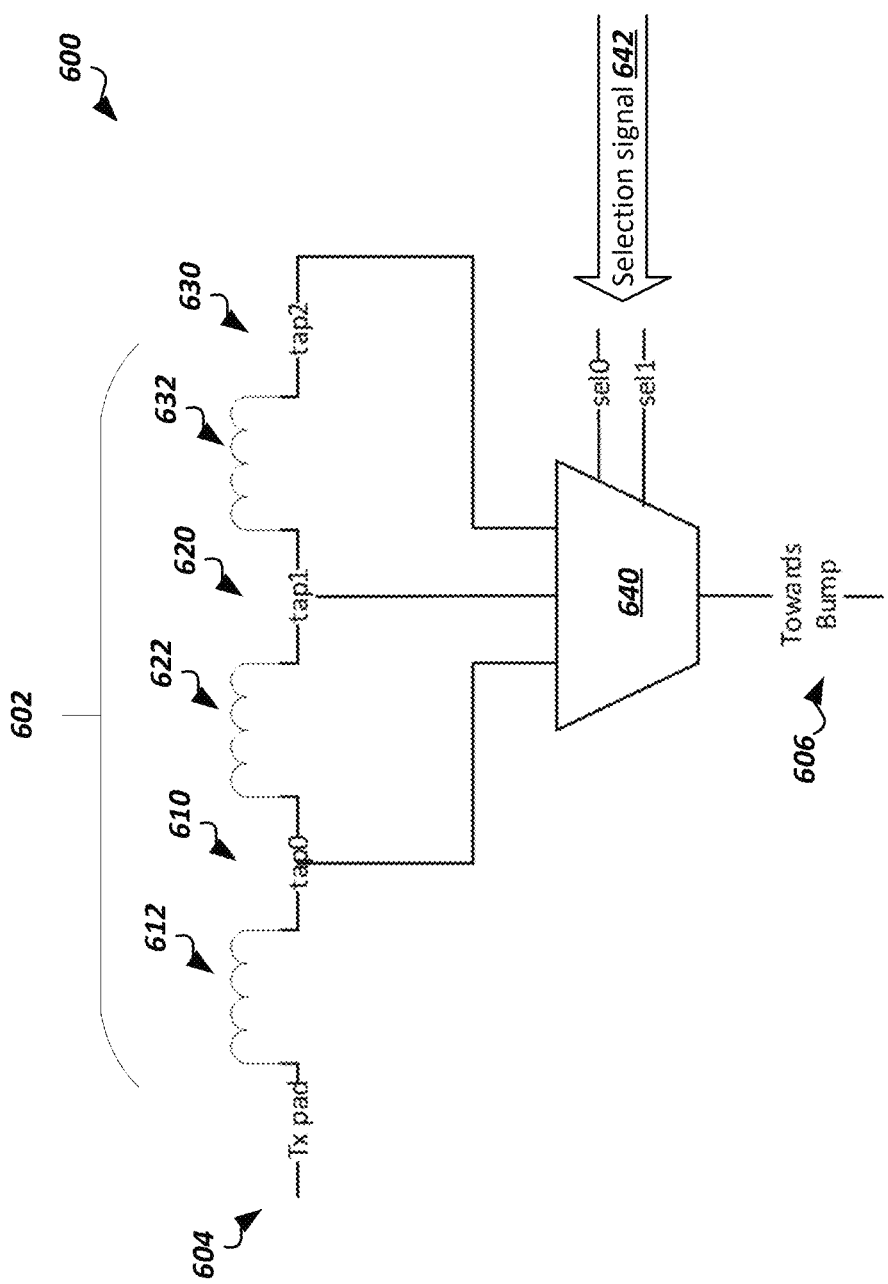
FIG. 6 illustrates an example tapped coil system that can be used in inductive coupling structures of the present disclosure.

FIG. 6 illustrates an example tapped coil system 600 that can be used in inductive coupling structures of the present disclosure. In the example shown, the tapped coil system 600 includes a coil 602 that includes three taps 610, 620, 630. The taps represent different output paths for a signal input at input 604 (which may be attached to Tx circuitry (e.g., a Tx pad) as shown). That is, when tap 610 is selected, the portion 612 of the coil 602 is the effective inductor of the inductive coupling structure presented to the output 606. Likewise, when tap 620 is selected, the portions 612 and 622 of the coil 602 are the effective inductor of the inductive coupling structure to the output 606, and when tap 630 is selected, all of the portions 612, 622, 632 of the coil 602 are the effective inductor of the inductive coupling structure to the output 606.

In the example shown, the selection of the tap is provided by the multiplexer 640 based on a selection signal 642, which is two bits in the example shown (however, any suitable selection signal may be used in other embodiments). The sel0 and sel1 indicate bit inputs of the selection signal 642 to the multiplexer 640, e.g., where "00" selects tap0, "01" selects tap1, and "10" selects tap2. In certain embodiments, the tap selection can be optimized by a specific selection signal provided to the multiplexer 640. In other embodiments, the selection can be trained with full platform I/O margin training in other instances. In some instances, the taps may be used to change a ratio between the coils of an inductive coupling structure, e.g., to 2:1 instead of 1:1 (or any other suitable ratio). It will be understood that any number of taps may be included in the tapped coil system (e.g., fewer or more than the three taps shown in FIG. 6).

Figure 7:
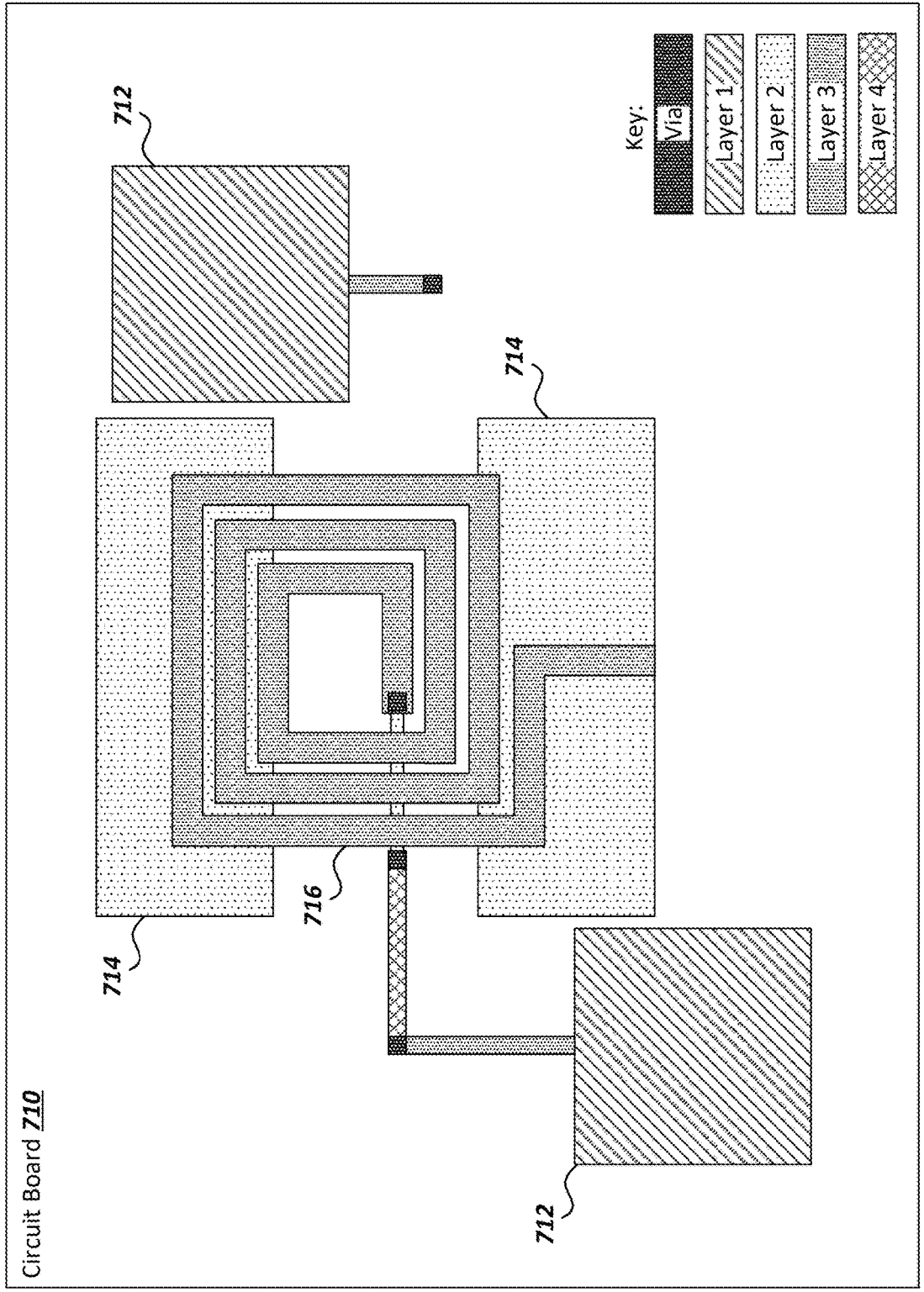
FIG. 7 illustrates an example circuit board that includes an inductive coupling structure in accordance with embodiments of the present disclosure.

FIG. 7 illustrates an example circuit board 710 that includes an inductive coupling structure in accordance with embodiments of the present disclosure. It will be understood that, for the sake of simplicity, FIG. 7 does not show each element of the circuit board 710 or the inductive coupling structure, and instead illustrates certain portions of a circuit board implementation to show an example arrangement or positioning of an inductive coil structure between existing pads of a circuit board. The example circuit board 710 includes pads or bumps 712, ground pads 714, and a coil 716 of an inductive coupling structure of the present disclosure. The ground pads 714 may be implemented, in certain instances, to control the inductances of the coils or to shield the coils from other circuit components. Although one coil is shown, it will be understood that another coil will be included on the circuit board as well, e.g., on an adjacent layer of the circuit board (e.g., as shown in FIG. 3). As indicated by the key in FIG. 7, each of these items may be implemented on different layers of the circuit board 710 (e.g., pads 712 on layer 1, ground pads 714 on layer 2, the coil 716 on layer 3, and certain traces on layer 4) and may be connected by vias.

Figure 8C:
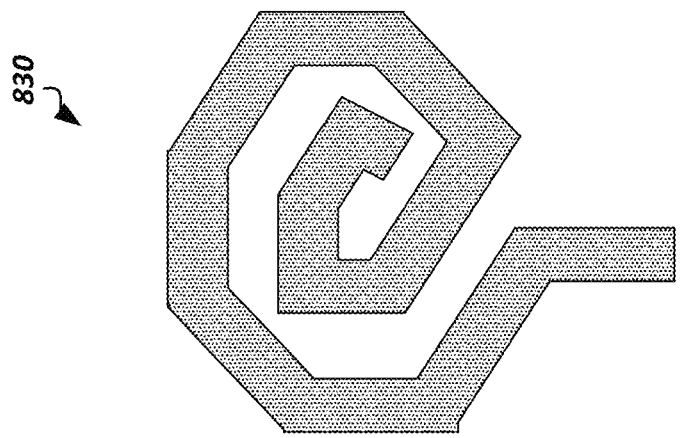
FIGS. 8A-8C illustrate example coil shapes that may be implemented in inductive coupling structures of the present disclosure.
Figure 8B:
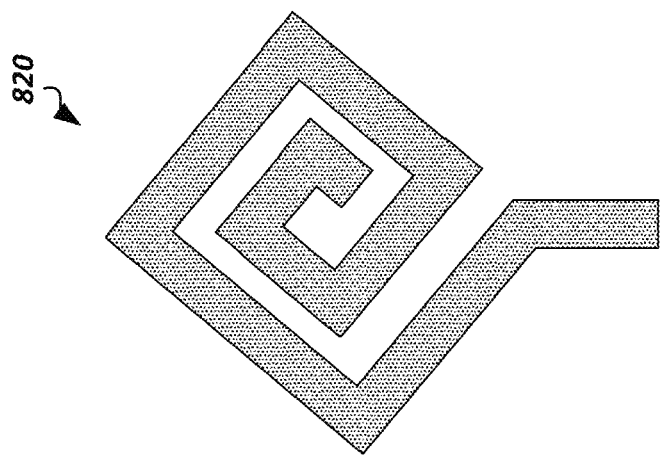
Figure 8A:
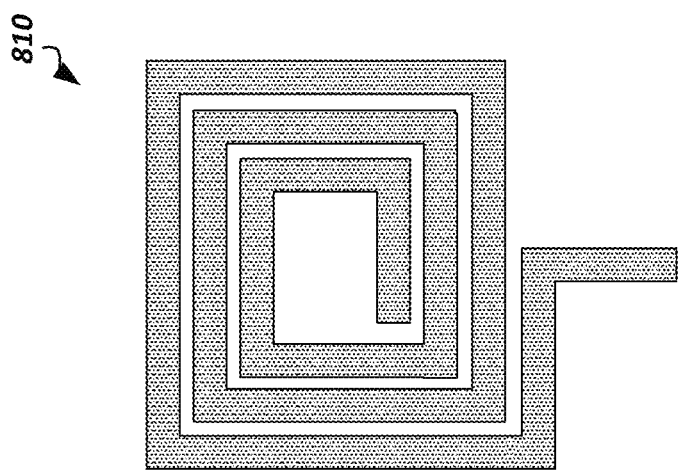

FIGS. 8A-8C illustrate example coil shapes that may be implemented in inductive coupling structures of the present disclosure. In particular, FIGS. 8A and 8B illustrate rectangular shaped coils 810, 820 in different orientations, and FIG. 8C illustrates coil 830 with a non-uniform shape. Any other suitable shaped coil may be used in inductive coupling structures of the present disclosure, such as circular shaped coils, oval shaped coils, hexagonal shaped coils, octagonal shaped coils, etc.

Figure 9:
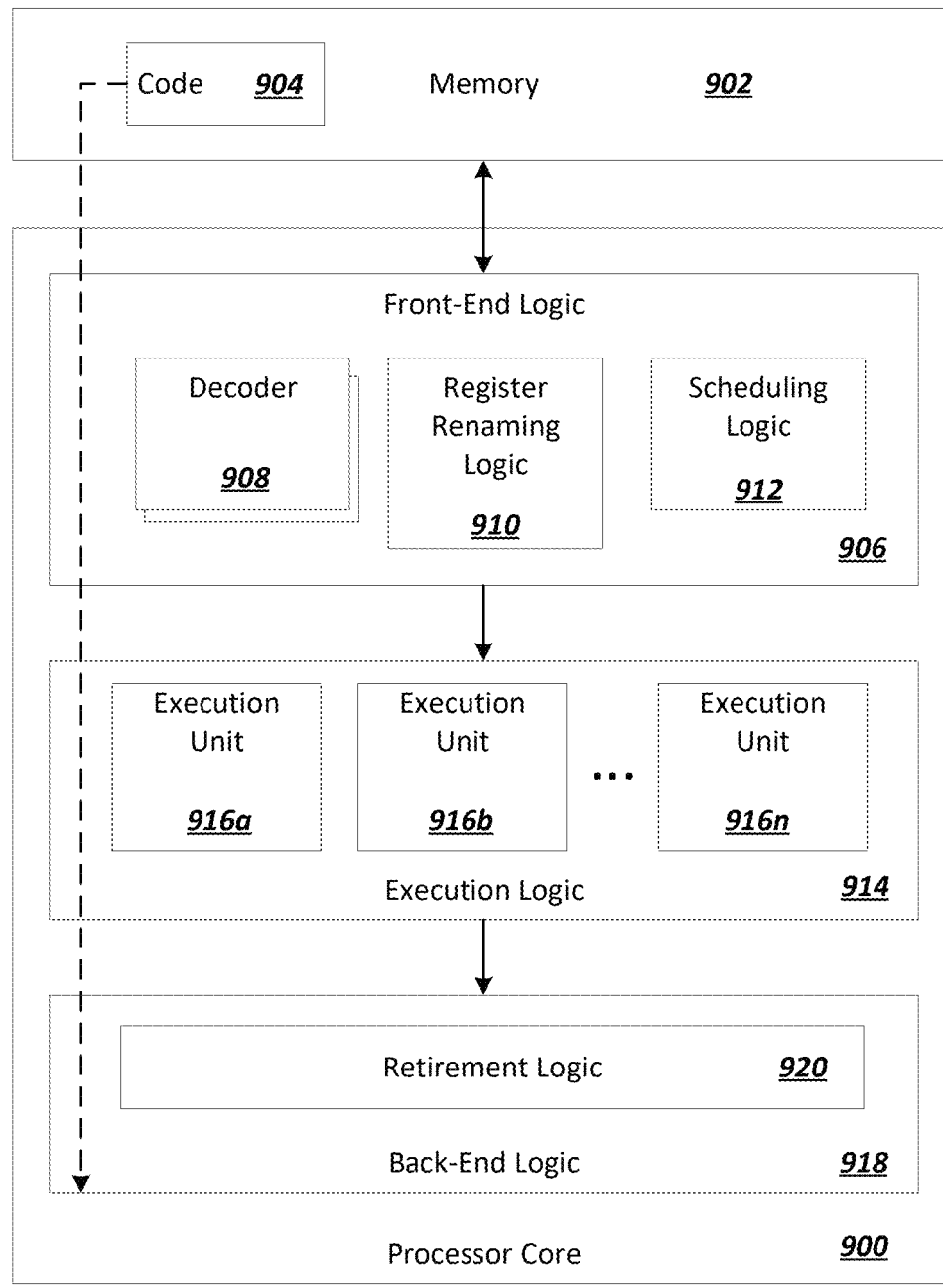
FIG. 9 is an example illustration of a processor according to an embodiment.
Figure 10:
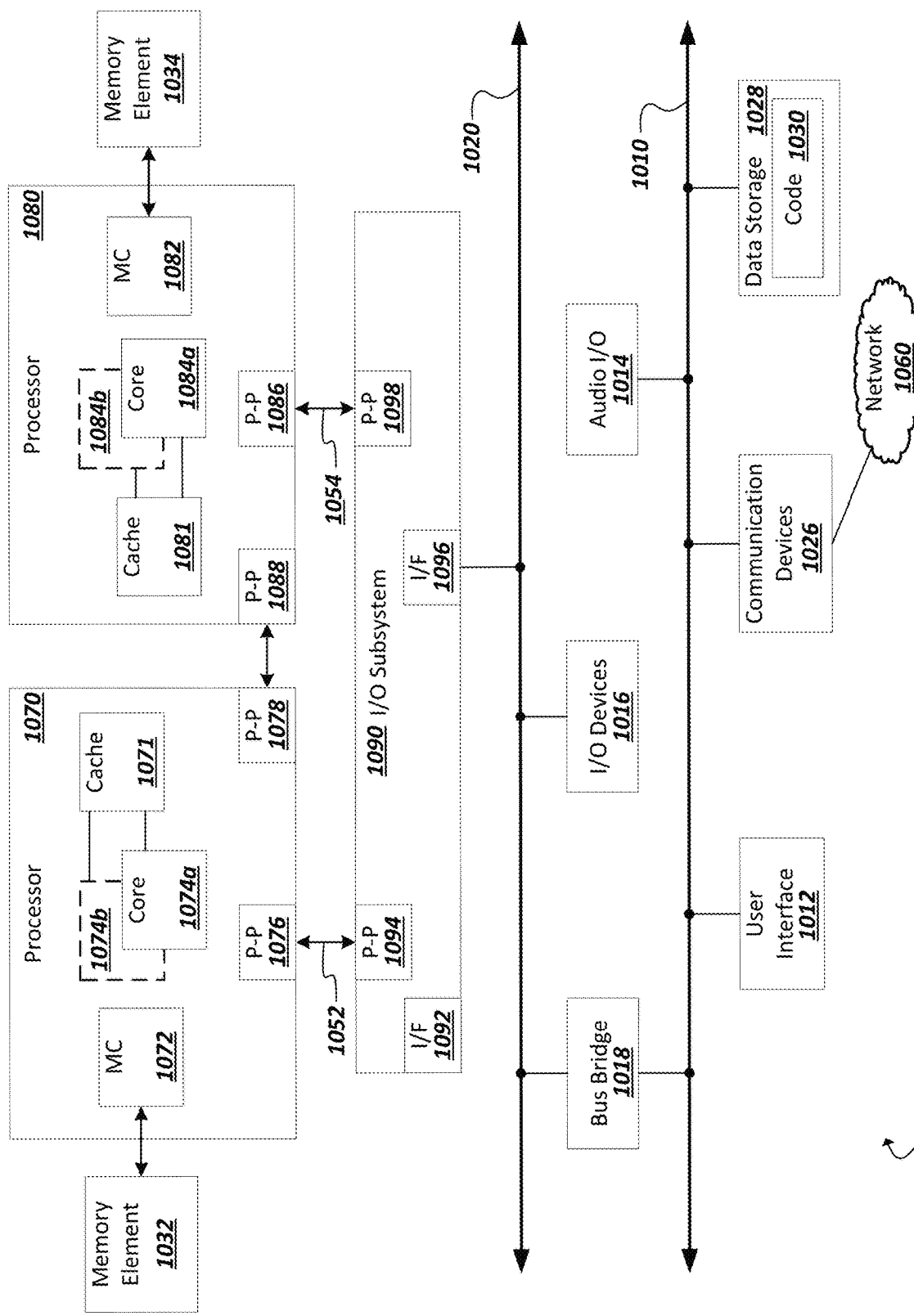
FIG. 10 illustrates a computing system that is arranged in a point-to-point (PtP) configuration according to an embodiment.

FIGS. 9-10 are block diagrams of example computer architectures that may be used in accordance with embodiments disclosed herein. For example, in some embodiments, a computer system may contain one or more aspects shown in FIGS. 9-10 and may implement one or more aspects of the present disclosure described above. Other computer architecture designs known in the art for processors and computing systems may also be used. Generally, suitable computer architectures for embodiments disclosed herein can include, but are not limited to, configurations illustrated in FIGS. 9-10.

FIG. 9 is an example illustration of a processor according to an embodiment. Processor 900 is an example of a type of hardware device that can be used in connection with the implementations above. Processor 900 may be any type of processor, such as a microprocessor, an embedded processor, a digital signal processor (DSP), a network processor, a multi-core processor, a single core processor, or other device to execute code. Although only one processor 900 is illustrated in FIG. 9, a processing element may alternatively include more than one of processor 900 illustrated in FIG. 9. Processor 900 may be a single-threaded core or, for at least one embodiment, the processor 900 may be multi-threaded in that it may include more than one hardware thread context (or "logical processor") per core.

FIG. 9 also illustrates a memory 902 coupled to processor 900 in accordance with an embodiment. Memory 902 may be any of a wide variety of memories (including various layers of memory hierarchy) as are known or otherwise available to those of skill in the art. Such memory elements can include, but are not limited to, random access memory (RAM), read only memory (ROM), logic blocks of a field programmable gate array (FPGA), erasable programmable read only memory (EPROM), and electrically erasable programmable ROM (EEPROM).

Processor 900 can execute any type of instructions associated with algorithms, processes, or operations detailed herein. Generally, processor 900 can transform an element or an article (e.g., data) from one state or thing to another state or thing.

Code 904, which may be one or more instructions to be executed by processor 900, may be stored in memory 902, or may be stored in software, hardware, firmware, or any suitable combination thereof, or in any other internal or external component, device, element, or object where appropriate and based on particular needs. In one example, processor 900 can follow a program sequence of instructions indicated by code 904. Each instruction enters a front-end logic 906 and is processed by one or more decoders 908. The decoder may generate, as its output, a micro operation such as a fixed width micro operation in a predefined format, or may generate other instructions, microinstructions, or control signals that reflect the original code instruction. Front-end logic 906 also includes register renaming logic 910 and scheduling logic 912, which generally allocate resources and queue the operation corresponding to the instruction for execution.

Processor 900 can also include execution logic 914 having a set of execution units 916a, 916b, 916n, etc. Some embodiments may include a number of execution units dedicated to specific functions or sets of functions. Other embodiments may include only one execution unit or one execution unit that can perform a particular function. Execution logic 914 performs the operations specified by code instructions.

After completion of execution of the operations specified by the code instructions, back-end logic 918 can retire the instructions of code 904. In one embodiment, processor 900 allows out of order execution but requires in order retirement of instructions. Retirement logic 920 may take a variety of known forms (e.g., re-order buffers or the like). In this manner, processor 900 is transformed during execution of code 904, at least in terms of the output generated by the decoder, hardware registers and tables utilized by register renaming logic 910, and any registers (not shown) modified by execution logic 914.

Although not shown in FIG. 9, a processing element may include other elements on a chip with processor 900. For example, a processing element may include memory control logic along with processor 900. The processing element may include I/O control logic and/or may include I/O control logic integrated with memory control logic. The processing element may also include one or more caches. In some embodiments, non-volatile memory (such as flash memory or fuses) may also be included on the chip with processor 900.

FIG. 10 illustrates a computing system 1000 that is arranged in a point-to-point (PtP) configuration according to an embodiment. In particular, FIG. 10 shows a system where processors, memory, and input/output devices are interconnected by a number of point-to-point interfaces. Generally, one or more of the computing systems described herein may be configured in the same or similar manner as computing system 1000.

Processors 1070 and 1080 may also each include integrated memory controller logic (MC) 1072 and 1082 to communicate with memory elements 1032 and 1034. In alternative embodiments, memory controller logic 1072 and 1082 may be discrete logic separate from processors 1070 and 1080. Memory elements 1032 and/or 1034 may store various data to be used by processors 1070 and 1080 in achieving operations and functionality outlined herein.

Processors 1070 and 1080 may be any type of processor, such as those discussed in connection with other figures. Processors 1070 and 1080 may exchange data via a point-to-point (PtP) interface 1050 using point-to-point interface circuits 1078 and 1088, respectively. Processors 1070 and 1080 may each exchange data with a chipset 1090 via individual point-to-point interfaces 1052 and 1054 using point-to-point interface circuits 1076, 1086, 1094, and 1098. Chipset 1090 may also exchange data with a co-processor 1038, such as a high-performance graphics circuit, machine learning accelerator, or other co-processor 1038, via an interface 1039, which could be a PtP interface circuit. In alternative embodiments, any or all of the PtP links illustrated in FIG. 10 could be implemented as a multi-drop bus rather than a PtP link.

Chipset 1090 may be in communication with a bus 1020 via an interface circuit 1096. Bus 1020 may have one or more devices that communicate over it, such as a bus bridge 1018 and I/O devices 1016. Via a bus 1010, bus bridge 1018 may be in communication with other devices such as a user interface 1012 (such as a keyboard, mouse, touchscreen, or other input devices), communication devices 1026 (such as modems, network interface devices, or other types of communication devices that may communicate through a computer network 1060), audio I/O devices 1016, and/or a data storage device 1028. Data storage device 1028 may store code 1030, which may be executed by processors 1070 and/or 1080. In alternative embodiments, any portions of the bus architectures could be implemented with one or more PtP links.

The computer system depicted in FIG. 10 is a schematic illustration of an embodiment of a computing system that may be utilized to implement various embodiments discussed herein. It will be appreciated that various components of the system depicted in FIG. 10 may be combined in a system-on-a-chip (SoC) architecture or in any other suitable configuration capable of achieving the functionality and features of examples and implementations provided herein.

While some of the systems and solutions described and illustrated herein have been described as containing or being associated with a plurality of elements, not all elements explicitly illustrated or described may be utilized in each alternative implementation of the present disclosure. Additionally, one or more of the elements described herein may be located external to a system, while in other instances, certain elements may be included within or as a portion of one or more of the other described elements, as well as other elements not described in the illustrated implementation. Further, certain elements may be combined with other components, as well as used for alternative or additional purposes in addition to those purposes described herein.

Further, it should be appreciated that the examples presented above are non-limiting examples provided merely for purposes of illustrating certain principles and features and not necessarily limiting or constraining the potential embodiments of the concepts described herein. For instance, a variety of different embodiments can be realized utilizing various combinations of the features and components described herein, including combinations realized through the various implementations of components described herein. Other implementations, features, and details should be appreciated from the contents of this Specification.

Although this disclosure has been described in terms of certain implementations and generally associated methods, alterations and permutations of these implementations and methods will be apparent to those skilled in the art. For example, the actions described herein can be performed in a different order than as described and still achieve the desirable results. As one example, the processes depicted in the accompanying figures do not necessarily require the particular order shown, or sequential order, to achieve the desired results. In certain implementations, multitasking and parallel processing may be advantageous. Additionally, other user interface layouts and functionality can be supported. Other variations are within the scope of the following claims.

While this specification contains many specific implementation details, these should not be construed as limitations on the scope of any embodiments or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The following examples pertain to embodiments in accordance with this Specification. It will be understood that certain examples may be combined with certain other examples, in certain embodiments.

Example 1 includes an apparatus comprising: a circuit board comprising: a parallel bus comprising a first trace and a second trace; a first inductive coil coupled to the first trace; and a second inductive coil coupled to the second trace; wherein the first and second inductive coils are arranged to inductively couple with one another.

Example 2 includes the subject matter of Example 1, wherein the first coil is on a first layer of the circuit board and the second coil is on a second layer of the circuit board.

Example 3 includes the subject matter of Example 2, wherein the first and second layer are more than one layer apart from one another in the circuit board.

Example 4 includes the subject matter of Example 1, wherein the first coil comprises one or more taps to select between two or more different winding configurations of the first coil.

Example 5 includes the subject matter of Example 4, further comprising a multiplexer coupled to the one or more taps, the multiplexer to select the winding configuration of the first coil based on an input signal to the multiplexer.

Example 6 includes the subject matter of Example 5, wherein the multiplexer is to select the winding configuration based on a set of bits input to the multiplexer.

Example 7 includes the subject matter of any one of Examples 1-6, wherein the first coil in wound in the same direction as the second coil.

Example 8 includes the subject matter of any one of Examples 1-6, wherein the first coil in wound in the opposite direction as the second coil.

Example 9 includes the subject matter of any one of Examples 1-8, wherein the first and second coil have the same number of winds.

Example 10 includes the subject matter of any one of Examples 1-9, wherein the first and second coil are each rectangular in shape.

Example 11 includes the subject matter of any one of Examples 1-10, further comprising ground pads adjacent to the first and second inductive coils.

Example 12 includes the subject matter of any one of Examples 1-11, further comprising transmitter circuitry coupled to the parallel bus, the transmitter circuitry to transmit signals on the traces of the parallel bus.

Example 13 includes the subject matter of any one of Examples 1-11, further comprising receiver circuitry coupled to the parallel bus, the receiver circuitry to receive signals from the traces of the parallel bus.

Example 14 includes the subject matter of any one of Examples 1-13, wherein the apparatus is one or more of a system-on-chip (SoC), processor, motherboard, or memory device.

Example 15 includes a system comprising: a transmitter device; a receiver device; and a parallel bus communicatively coupling the transmitter and receiver devices, the parallel bus comprising a set of traces; wherein the transmitter device comprises inductive coils coupled to each of the parallel bus traces, and the inductive coils are arranged to inductively couple with one another.

Example 16 includes the subject matter of Example 15, wherein the transmitter device comprises a circuit board, a first coil of the inductive coils is on a first layer of the circuit board, and a second coil of the inductive coils is on a second layer of the circuit board.

Example 17 includes the subject matter of Example 16, wherein the first and second layers are adjacent to one another in the circuit board.

Example 18 includes the subject matter of any one of Examples 15-17, wherein the inductive coils comprise a set of taps, and the transmitter device further comprises one or more multiplexers to select winding configurations of the inductive coils.

Example 19 includes the subject matter of any one of Examples 15-17, wherein the inductive coils are wound in a derivative configuration.

Example 20 includes the subject matter of any one of Examples 15-17, wherein the inductive coils are wound in a differential configuration.

Example 21 includes the subject matter of any one of Examples 15-20, wherein the inductive coils are first inductive coils, and the receiver device comprises second inductive coils coupled to each of the parallel bus traces, the second inductive coils arranged to inductively couple with one another.

Example 22 includes the subject matter of any one of Examples 15-21, wherein the system is a system-on-chip (SoC) or computer system.

Example 23 includes the subject matter of any one of Examples 15-22, wherein the transmitter device is one or more of processor or memory device.

Example 24 includes a system comprising: a circuit board comprising a parallel bus, the parallel bus comprising a first trace and a second trace; and passive means for inductively coupling the first and second trace.

Example 25 includes the subject matter of Example 24, further comprising means for selecting an amount of inductive coupling between the first and second trace.

Example 26 includes the subject matter of Example 24 or 25, wherein the system is a system-on-chip (SoC) or computer system.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results.

What is claimed is:

1. An apparatus comprising:
    a circuit board comprising:
        a parallel bus comprising a first transmitter and a first receiver coupled via a first trace and a second transmitter and a second receiver coupled via a second trace;
        a first inductive coil coupled to the first trace; and
        a second inductive coil coupled to the second trace;
        wherein the first and second inductive coils are arranged to inductively couple with one another.

2. The apparatus of claim 1, wherein the first coil is on a first layer of the circuit board and the second coil is on a second layer of the circuit board.

3. The apparatus of claim 2, wherein the first and second layer are more than one layer apart from one another in the circuit board.

4. The apparatus of claim 1, wherein the first coil comprises one or more taps to select between two or more different winding configurations of the first coil.

5. The apparatus of claim 4, further comprising a multiplexer coupled to the one or more taps, the multiplexer to select the winding configuration of the first coil based on an input signal to the multiplexer.

6. The apparatus of claim 5, wherein the multiplexer is to select the winding configuration based on a set of bits input to the multiplexer.

7. The apparatus of claim 1, wherein the first coil in wound in the same direction as the second coil.

8. The apparatus of claim 1, wherein the first coil in wound in the opposite direction as the second coil.

9. The apparatus of claim 1, wherein the first and second coil have the same number of winds.

10. The apparatus of claim 1, wherein the first and second coil are each rectangular in shape.

11. The apparatus of claim 1, further comprising ground pads adjacent to the first and second inductive coils.

12. The apparatus of claim 1, further comprising receiver circuitry coupled to the parallel bus, the receiver circuitry to receive signals from the traces of the parallel bus.

13. The apparatus of claim 1, wherein the apparatus is one or more of a system-on-chip (SoC), processor, motherboard, or memory device.

14. A system comprising:
    a transmitter device;
    a receiver device; and
    a parallel bus communicatively coupling the transmitter and receiver devices, the parallel bus comprising a set of traces;
    wherein the transmitter device comprises inductive coils coupled to each of the parallel bus traces, and the inductive coils are arranged to inductively couple with one another.

15. The system of claim 14, wherein the transmitter device comprises a circuit board, a first coil of the inductive coils is on a first layer of the circuit board, and a second coil of the inductive coils is on a second layer of the circuit board.

16. The system of claim 15, wherein the first and second layers are adjacent to one another in the circuit board.

17. The system of claim 14, wherein the inductive coils comprise a set of taps, and the transmitter device further comprises one or more multiplexers to select winding configurations of the inductive coils.

18. The system of claim 14, wherein the inductive coils are wound in a derivative configuration.

19. The system of claim 14, wherein the inductive coils are wound in a differential configuration.

20. The system of claim 14, wherein the inductive coils are first inductive coils, and the receiver device comprises second inductive coils coupled to each of the parallel bus traces, the second inductive coils arranged to inductively couple with one another.

21. The system of claim 14, wherein the system is a system-on-chip (SoC) or computer system.

22. The system of claim 14, wherein the transmitter device is one or more of processor or memory device.

23. A system comprising:
    a circuit board comprising a parallel bus, the parallel bus comprising a first trace and a second trace; and
    passive means for inductively coupling the first and second trace.

24. The system of claim 23, further comprising means for selecting an amount of inductive coupling between the first and second trace.

* * * * *